(12) United States Patent
Jennings et al.

(10) Patent No.: US 7,595,208 B2
(45) Date of Patent: Sep. 29, 2009

(54) METHOD OF LASER ANNEALING USING TWO WAVELENGTHS OF RADIATION

(75) Inventors: Dean Jennings, Beverly, MA (US); Haifan Liang, Draper, UT (US); Mark Yam, Monte Sereno, CA (US); Vijay Parihar, Fremont, CA (US); Abhilash Mayur, Salinas, CA (US); Aaron Hunter, Santa Cruz, CA (US); Bruce Adams, Portland, OR (US); Joseph Michael Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 123 days.

(21) Appl. No.: 11/837,055

(22) Filed: Aug. 10, 2007

(65) Prior Publication Data

US 2007/0293058 A1 Dec. 20, 2007

Related U.S. Application Data

(62) Division of application No. 11/105,270, filed on Apr. 13, 2005, now Pat. No. 7,279,721.

(51) Int. Cl.
*H01L 21/00* (2006.01)
(52) U.S. Cl. .......... 438/31; 257/E21.134; 257/E21.347; 257/E21.333; 257/E21.475
(58) Field of Classification Search ............... None
See application file for complete search history.

(56) References Cited

U.S. PATENT DOCUMENTS 4,234,356 A 11/1980 Auston et al.

(Continued)

FOREIGN PATENT DOCUMENTS

JP 63 080521 A 4/1988

(Continued)

OTHER PUBLICATIONS

"Method for Laser Annealing of Polysiicon with reduced damage", IBM Technical Disclosure Bulletin, Feb. 1981, 4143 p.

(Continued)

*Primary Examiner*—W. David Coleman
*Assistant Examiner*—Sonya D McCall-Shepard
(74) *Attorney, Agent, or Firm*—Law Offices of Charles Guenzer (57) ABSTRACT

A thermal processing apparatus and method in which a first laser source, for example, a $CO_2$ emitting at 10.6 μm is focused onto a silicon wafer as a line beam and a second laser source, for example, a GaAs laser bar emitting at 808 nm is focused onto the wafer as a larger beam surrounding the line beam. The two beams are scanned in synchronism in the direction of the narrow dimension of the line beam to create a narrow heating pulse from the line beam when activated by the larger beam. The energy of GaAs radiation is greater than the silicon bandgap energy and creates free carriers. The energy of the $CO_2$ radiation is less than the silicon bandgap energy so silicon is otherwise transparent to it, but the long wavelength radiation is absorbed by the free carriers.

20 Claims, 4 Drawing Sheets

U.S. PATENT DOCUMENTS

| | | |
|---|---|---|
| 4,375,993 A | 3/1983 | Mori et al. |
| 5,612,251 A | 3/1997 | Lee |
| 5,767,003 A | 6/1998 | Noguchi |
| 5,803,965 A | 9/1998 | Yoon |
| 5,959,779 A | 9/1999 | Yamazaki et al. |
| 6,066,516 A | 5/2000 | Miyasaka |
| 6,281,057 B2 | 8/2001 | Aya et al. |
| 6,514,339 B1 | 2/2003 | Jung |
| 6,531,681 B1 | 3/2003 | Markle et al. |
| 6,558,991 B2 | 5/2003 | Yamazaki et al. |
| 6,632,749 B2 | 10/2003 | Miyasaka et al. |
| 6,693,257 B1 | 2/2004 | Tanaka |
| 6,730,550 B1 | 5/2004 | Yamazaki et al. |
| 6,747,245 B2 | 6/2004 | Talwar et al. |
| 6,974,731 B2 | 12/2005 | Yamazaki et al. |
| 6,987,240 B2 | 1/2006 | Jennings et al. |
| 7,005,601 B2 | 2/2006 | Jennings |
| 2004/0198028 A1 | 10/2004 | Tanaka et al. |
| 2004/0253838 A1 | 12/2004 | Yamazaki et al. |

FOREIGN PATENT DOCUMENTS

| | | |
|---|---|---|
| JP | 2001 044120 A | 2/2001 |
| WO | WO 03/089184 A1 | 10/2003 |

OTHER PUBLICATIONS

I. W. Boyd "Absorption of infrared radiation in silicon", J. App. Phys., vol. 55, No. 8, Apr. 15, 1984, 3061-3063 pp.

(Prior Art)

METHOD OF LASER ANNEALING USING TWO WAVELENGTHS OF RADIATION

RELATED APPLICATION

The application is a division of Ser. No. 11/105,270, filed Apr. 13, 2005, for which the notice of allowance has been received.

FIELD OF THE INVENTION

The invention relates generally to thermal processing of semiconductor substrates. In particular, the invention relates to laser thermal processing of semiconductor substrates in which a line beam is scanned across the substrate.

BACKGROUND ART

The fabrication of semiconductor integrated circuits has long required multiple steps of thermal processing a silicon wafer or other semiconductor wafer. The wafer may need to be raised to a temperature of 600° C. or well above to thermally activate a process. Such processes, though not so limited, may include chemical vapor deposition, silicidation, oxidation or nitridation, implant anneal, and dopant activation among others. Some of these processes may require temperatures in excess of 1000° C., 1200° C., or even above 1350° C., the last of which is relatively close to the melting point 1416° C. of silicon.

Such thermal processing was originally performed in ovens typically containing many wafers supported in a fixture. Electrical power is applied to resistive heater elements in the oven walls to heat them to a temperature close to the desired processing temperature. The wafers eventually assume a temperature substantially equal to that of the oven walls. After the desired length of thermal processing at the elevated temperature, no more power is applied to the resistance heaters so that the walls gradually cool, as do the wafers. Both the heat-up rates and the cool-down rates are relatively slow, on the order of 15° C./min even though the required thermal processing time may be relatively short. Such long periods at elevated temperatures substantially increase the thermal budget required for thermal processing. The fine features and thin layers in advanced integrated circuits require that the thermal budget be reduced.

Rapid thermal processing (RTP) has been developed to increase the cooling and heating rates. An RTP chamber typically contains a large number of high-intensity halogen lamps directed at a single wafer. The lamps can be quickly turned on to their highest filament temperature to quickly heat the wafer with little heating of the chamber itself. When the lamps are turned off, the portion of the lamps at the highest temperature constitutes a relatively small mass, which can quickly cool. The RTP chamber walls are not heated to very high temperatures. As a result, the wafer can radiatively cool at a reasonably high cooling rate. A typical RTP heat-up rate is about 250° C./s and a typical RTP cool-down rate is about 90° C./s, thus drastically reducing the thermal budget. In a technique called spike annealing, there is essentially no soak time at the maximum temperature. Instead, the ramp up is immediately followed by a ramp down. In most situations, the ramp rates should be maximized.

However, the cooling and heating rates of RTP and even spike annealing are becoming insufficient for advanced devices having ultra-narrow features and shallow and abrupt junctions, both of which require precise thermal control. Both ovens and RTP heat an entire wafer to the required processing temperature. In fact, only the upper few microns of material at the wafer surface require thermal processing. Furthermore, the blanket thermal irradiation pattern of RTP requires cooling of the entire wafer from the annealing temperature, both by radiative and conductive heat transfer. The radiative cooling becomes less effective as the wafer cools.

Pulsed laser thermal processing has been developed to dramatically increase the heating and cooling rates. Short (about 20 ns) pulses of laser radiation are focused at a reduced area of the wafer, ideally the same size as the optical stepper field in the neighborhood of 20 mm by 30 mm. The total energy of the laser pulse is sufficient to immediately heat the surface of the irradiated area to a high temperature. Thereafter, the small volume of heat generated by the shallow laser pulse quickly diffuses into the unheated lower portions of the wafer, thereby greatly increasing the cooling rate of the irradiated surface region. Several types of high-power lasers can be pulsed at a repetition rate of hundreds of pulses per second. The laser is moved in a step-and-repeat pattern over the surface of the wafer and is pulsed in neighboring areas to similarly thermally process the entire wafer surface.

Pulsed laser thermal processing, however, presents uniformity problems arising in part from the short, intense radiation pulses on a patterned surface. The scanning and pulses need to be carefully aligned and neither the radiation profile nor the lateral heat diffusion pattern is flat. The radiation pulse is so short that any difference in absorption will result in a large difference in temperature. One portion of the structure may melt while another portion a micron away is barely heated. To address this problem, a new class of laser thermal processing equipment has been developed in which a narrow line beam of continuous wave (CW) laser radiation having a long dimension and a short dimension is scanned over the wafer in a direction along the short dimension, that is, perpendicular to the line. The line width is small enough and the scan speed high enough that the scanned line of radiation produces a very short thermal pulse at the surface, which thereafter quickly diffuses vertically into the substrate and horizontally to lower-temperature surface regions. The process may be referred to as thermal flux annealing.

The three types of annealing can be distinguished in thermodynamical terms. RTP and thermal annealing are isothermal processes in which every region of the wafer is at essentially the same temperature at a given time. Pulsed laser annealing is adiabatic. The radiation pulse has ended before any heat can significantly diffuse. Thermal flux annealing is faster than the isothermal RTP process but slower than the adiabatic pulsed process. Heat has a thermal diffusion length of between 5 and 100 μm in conventional electronic materials, a length which allows some thermal homogenization on the scale of integrated circuit patterning.

Markle et al. (hereafter Markle) discloses a reflective-optics version of such a linear scanning thermal processing system in U.S. Pat. No. 6,531,681. Jennings et al. (hereafter Jennings) discloses refractive-optics versions in U.S. Published Application 2003/0196996, although there are other substantial differences between Markle and Jennings. In some embodiments, the Jennings thermal apparatus can achieve ramp rates of 106° C./s with beam line widths of less than 100 μm.

Figure 1:
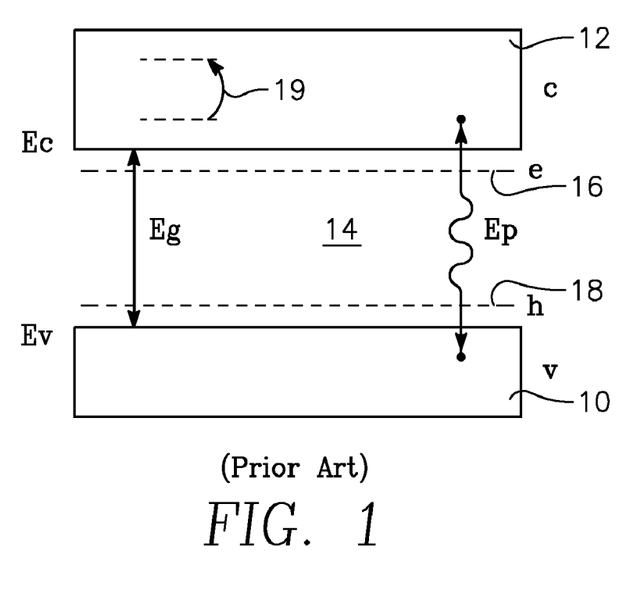
FIG. 1 is a schematic diagram of electronic energy bands and optical transitions in a semiconductor.

However, both Markle and Jennings prefer the use of laser diode bars lined up along the long direction of the beam to produce laser radiation These laser diode bars are typically composed of GaAs or similar semiconductor materials and are composed of a number of diode lasers formed in a same layer of an opto-electronic chip. The GaAs laser bars preferred by Markle emit near-infrared radiation at a wavelength of about 808 nm, which couples well into silicon. As illustrated in the energy band diagram of FIG. 1, semiconducting silicon like most semiconductors has a valence band 10 of electron states with energies lower than $E_v$ and a conduction band 12 of electron states at energies above $E_c$. In direct bandgap semiconductors, a bandgap 14 of energy $E_g$ separates the valence and conduction bands 10, 12. In undoped silicon, no electron states exist in the bandgap 14. For silicon, $E_g$=1.12 eV, which corresponds to an optical wavelength $\lambda_g$ of 1110 nm according to the well known photon equation $$E = \frac{hc}{\lambda},$$

where h is Planck's constant and c is the speed of light. At a temperature of absolute zero in an indirect-bandgap semiconductor such as silicon, the valence band 10 is completely filled and the valence band 12 is completely empty.

Light having a photon energy of $E_p$ passing through such a semiconductor will interact with the electrons only if its photon energy is greater than or equal to the bandgap, $$E_p \geq E_g$$

so that the photon can excite an electron in the valence band 10 to the conduction band 12, where it is a free carrier. Once the electron is in the conduction band, it quickly thermalizes and heats the semiconductor body.

The situation changes when the silicon is heated to a high temperature at which thermal energy excites electrons from the valence band 10 to the conduction band 12 leaving holes (empty electron states) in the valence band 10 and electrons in the conduction band 12, both of which are free carriers. Lower energy photons can excite valence electrons into the holes within the valence band 10 or can excite thermally excited conduction electrons into the generally empty states within the conduction band 12. However, this effect is generally small below about 800° C. Another effect arises when the semiconductor is doped, either with n-type dopants to produce electron states 16 within the bandgap but close to the conduction band 12 or with p-type dopants to produce hole states 18 close to the valence band 10. These dopant states are important for the operation of semiconductors because at moderate temperatures they are sufficient to excite the electron states 16 into the conduction band 12 or hole states into the valence band 10 (which can be visualized alternatively as exciting a valence electron into the hole state 18). Lower-energy photons can interact with such excited dopants states. For example, intra-band transitions resulting in absorption of the incident radiation may occur between two free-carrier states within the valence band 10 or within the conduction band 12. However, the absorption provided by this effect is relatively small below doping levels of about $10^{18}$ cm$^{-3}$, far above the average doping level in semiconductor devices. In any case, the laser absorption should not critically depend upon temperature and the doping level of the irradiated area, as is the situation with intra-band absorption between free carriers. It is preferred to rely on inter-band transitions for laser heating rather than upon intra-band absorption involving free carriers for which temperature and doping levels have profound effects.

Hence, laser radiation for rapidly heating silicon should have a wavelength substantially less than 1110 nm, which is easily provided by GaAs diode laser. Diode lasers, however, suffer several drawbacks. Laser bars create a problem in focusing their output into a beam uniform along its length. The radiation from a laser bar is output separately from a number of diode lasers spaced along the length of the bar with gaps between them. That is, the linear uniformity at the laser source is not good and needs to be improved by an homogenizer. The technology for homogenizers is available, but applying them to high intensity beams presents engineering and operational problems. A further problem is that laser bar radiation at 808 nm has an absorption depth of about 800 nm in silicon, which may be greater than the depth of the silicon layer requiring annealing, such as shallow source and drain implants needing implant curing and dopant activation.

In U.S. Pat. No. 6,747,245, Talwar et al. (hereafter Talwar) suggests using radiation from a carbon dioxide ($CO_2$) laser to produce line beams for laser thermal processing. Although $CO_2$ lasers have a lower efficiency (10 to 15%) than diode lasers (40 to 50%), they can more easily produce a well collimated (non-divergent) and generally circular beam. However, we believe that $CO_2$ radiation having a wavelength of about 10.6 µm is ineffective as the sole source of laser radiation since the 10.6 µm wavelength is much greater than the silicon bandgap wavelength of 1.11 µm. As a result, undoped or low-temperature silicon is virtually transparent to $CO_2$ radiation and the $CO_2$ radiation is not effectively absorbed in a silicon wafer, more or less its shallow surface region desired for advanced microprocessing. Although not disclosed by Markle, absorption of the $CO_2$ radiation may be enhanced by heating the silicon to either to a very high temperature or by relying upon heavy doping or a combination thereof. However, the heating apparatus complicates the laser thermal processing apparatus, and the doping levels cannot be freely controlled in semiconductor fabrication and vary across the partially developed integrated circuit.

Boyd et al. (hereafter Boyd) discloses a dual-wavelength thermal processing technique in "Absorption of infrared radiation in silicon," *Journal of Applied Physics*, vol. 55, no. 8, 15 Apr. 1984, pp. 3061-3063. Boyd emphasizes that the quantum energy of 10.6 µm radiation is two orders of magnitude smaller than the silicon bandgap. As a result, silicon is essentially transparent to $CO_2$ radiation. Even for heavily doped silicon, the absorption coefficient is less than 100 cm$^{-1}$, a value too small for surface laser thermal processing. Instead, Boyd proposes either pre-heating the silicon or more preferably irradiating the silicon with 500 nm radiation from a CW argon laser, having an energy greater than the bandgap, to increase the free carrier density in silicon and promote absorption of $CO_2$ radiation. Boyd does not address the spatial extent of his beams and admits to poor spatial definition, issues that are crucial for advanced laser thermal processing.

SUMMARY OF THE INVENTION

A thermal processing apparatus particularly useful for thermal treatment of semiconductor integrated circuits formed on a wafer includes a first laser source emitting at a short wavelength, for example, less than 1.0 µm and a second laser source emitting at a long wavelength, for example, greater than 1.2 µm, preferably greater than 5 µm, and most preferably $CO_2$ laser radiation of wavelength near 10.6 µm. The heating beam from the second source is imaged into a relatively narrow line beam on the wafer, for example, having a width of no more than 0.1 mm and a length of at least 1 mm. The activating beam from the first source is imaged into a relatively large beam on the wafer that surrounds the line beam from the second source. The two beams are scanned in synchronism in the direction of the narrow dimension of the line beam either by movement of the wafer or movement of the optics.

Another aspect of the invention includes an acousto-optical modulator which can be used either to remove in homogeneity or speckle in an optical beam or for scanning a narrow beam perpendicular to the physical scanning direction to create a line pattern of radiation.

The heating beam may effectively radiate the sample at angles near 40° off normal.

A further aspect of the invention includes the optics used to form a homogeneous line beam. A one-axis light pipe may be used for this purpose.

A CCD array may thermally image the vicinity being irradiated.

The wavelength of the activating light may be selected to control the depth of heating the substrate.

DETAILED DESCRIPTION OF THE PREFERRED EMBODIMENTS

Figure 2:
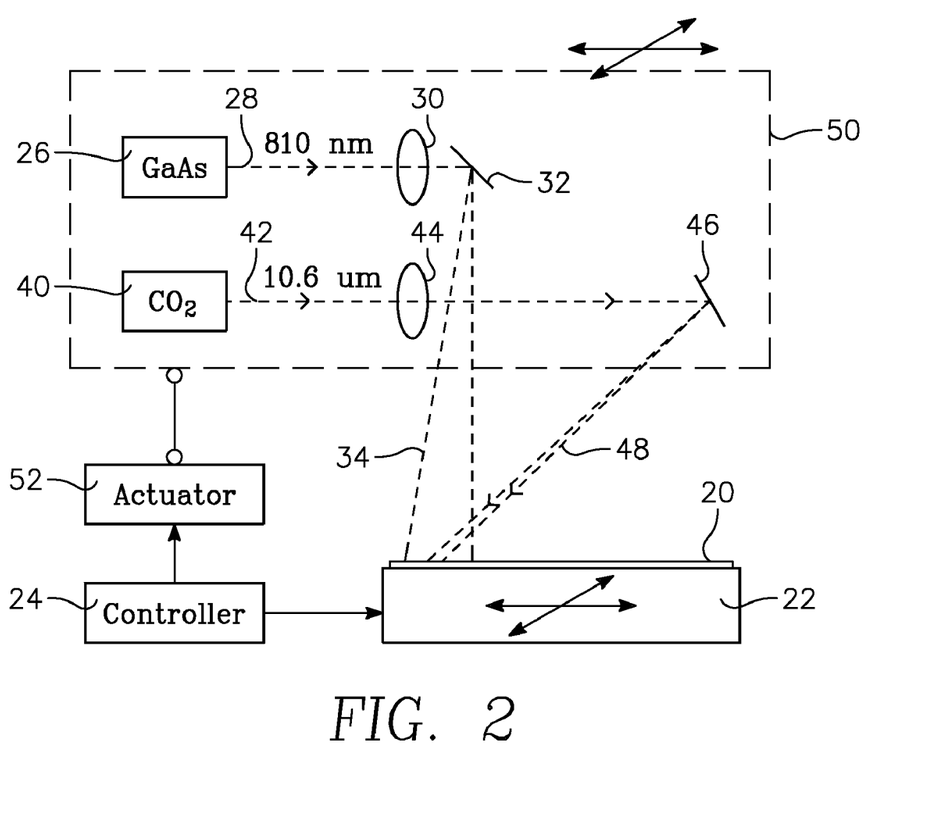
FIG. 2 is a schematic elevations view of an embodiment of a dual-wavelength laser annealing apparatus of the invention.

A simplified representation of one embodiment of the invention is schematically illustrated in the elevational view of FIG. 2. A wafer 20 or other substrate is held on a stage 22 that is motor driven in one or two directions under the control of a system controller 24. A short-wavelength laser 26, such as a GaAs laser bar, emits a visible or nearly visible continuous wave (CW) beam 28 at a wavelength which is shorter than the silicon bandgap wavelength of about 1.11 µm. For the GaAs laser 26, the emission wavelength is typically about 810 nm, which can be characterized as red. First optics 30 focus and shape the beam 28 and a reflector 32 redirects the beam 28 towards the wafer 20 in a relatively wide activating beam 34, also illustrated in the plan view of FIG. 3. The activating beam 34 may be inclined at some angle, for example, of 15° with respect to the wafer normal to prevent reflection back to the GaAs laser 26. Such reflected radiation may shorten the lifetime of diode lasers. A long-wavelength laser 40, preferably a $CO_2$ laser, emits an infrared CW beam 42 at a wavelength longer than the silicon bandgap wavelength of 1.11 µm. For the preferred $CO_2$ laser, the emission wavelength is near 10.6 µm. Second optics 44 focus and preferably shape the $CO_2$ beam 42 and a second reflector 46 reflects the $CO_2$ beam 42 into a relatively narrow heating beam 48. Preferably, the $CO_2$ heating beam 48 is inclined at the Brewster angle, which is about 72° for silicon, with respect to the wafer normal so as to maximize coupling of the heating beam 48 into the wafer 20. Incidence at the Brewster angle is most effective for p-polarized radiation, that is, radiation polarized along the surface of the wafer 20 since there is no reflected radiation arising from the fact that there is a 90° angle between the refracted beam in the wafer 20 and any reflected beam. Therefore, s-polarized light is advantageously suppressed over p-polarized light in the $CO_2$ beam 18. However, experiments have shown that a 20° cone of radiation centered at 40° (±10°) from the wafer normal results in a variability of absorption about 3.5% for a number of patterns that is nearly as good as the 2.0% achieved with a cone centered at the Brewster angle.

Figures 3, 4, 6:
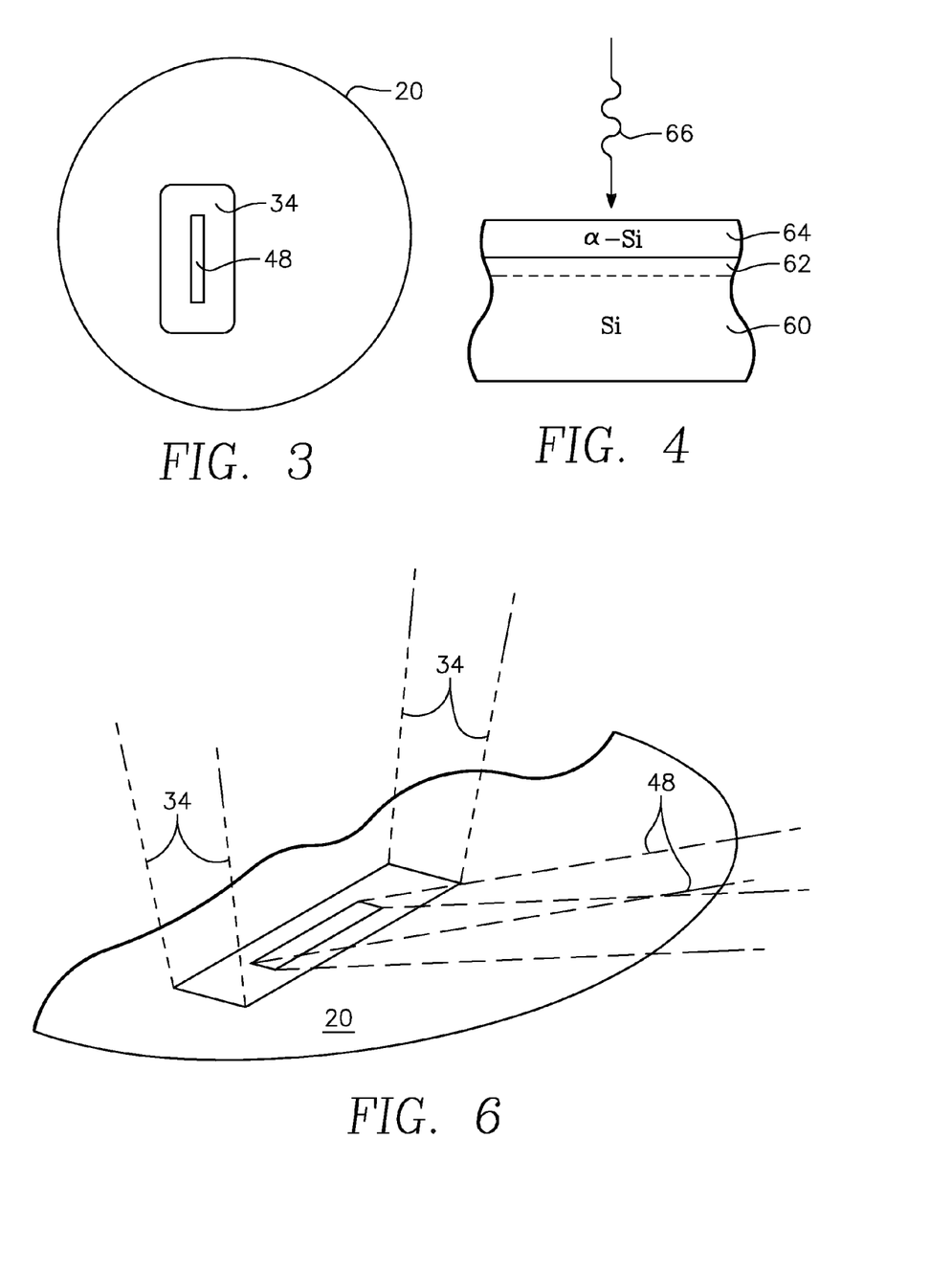
FIG. 3 is a plan view of the outline of a heating beam and an activating beam striking a wafer being laser annealed.
FIG. 4 is a cross-sectional view of a silicon structure to which the invention can be applied.
FIG. 6 is an exploded orthographic view of the two beams striking the wafer.

As illustrated in FIG. 3, the long-wavelength ($CO_2$) heating beam 48 is located within and preferably centered on the larger short-wavelength (visible) activating beam 34. Both beams 34, 48 are synchronously scanned across the wafer 20 as the stage 22 moves the wafer 20 relative to the optical source 50 comprising the lasers 26, 40 and optical elements 30, 32, 44, 46. It is alternatively possible that the wafer 20 is held stationary while an actuator 52 moves all or part of the optical source 50 in one or two directions parallel to the surface of the wafer 20 in accordance to signals from the controller 24.

The beam shapes on the wafer 20 are substantially rectangular or at least highly elliptical for both the infrared heating beam 48 and the visible activating beam 34. It is understood that the illustrated beam shapes are schematic and represent some fraction of the center intensity since the beams in fact have finite tails extending beyond the illustrated shapes. Further, the infrared beam 48 is preferably nearly centered on the larger visible beam 34 as both beams 34, 48 are simultaneously moved relative to the wafer 20.

The general effect is that the larger visible beam 34, which is sharply attenuated in the silicon, generates free carriers in a somewhat large region generally close to the wafer surface. The smaller infrared beam 48, which otherwise is not absorbed by the unirradiated silicon, interacts with the free carriers generated by the visible beam 34 and its long-wavelength radiation is efficiently absorbed and converted to heat, thereby quickly raising the temperature in the area of the infrared beam 48.

The temperature ramp rates and scanning speeds are primarily determined by the size of the small infrared beam 48 while the larger visible beam 34 should encompass the small infrared beam 48. The width of the small heating beam 48 in the scan direction determines in part the temperature ramp rate and is minimized in most applications. The length of the small heating beam 48 perpendicular to the scan direction should be large enough to extend over a sizable fraction of the wafer and thus to anneal the sizable fraction in one pass. Typically, the length of the line beam is at least ten times its width. Optimally, the length equals or slightly exceeds the wafer diameter. However, for commercially feasible applications, the length may be on the order of millimeters. An exemplary size of the small heating beam 48 on the wafer is 0.1 mm×1 mm although other sizes may be used. Smaller widths are generally more desirable, for example, less than 500 µm or less than 175 µm. The larger activating beam 34 may be larger than the heating beam 48 by, for example, 1 mm so that in the exemplary set of dimensions it would extend about 1 mm in the scan direction and a few millimeters in the perpendicular direction.

The dual wavelengths produce the result that more infrared absorption is concentrated in the surface region in which the visible radiation is absorbed. The depth of the surface region is less than the absorption length of $CO_2$ radiation by itself. The room-temperature attenuation depth of visible radiation in silicon rapidly decreases in the visible spectrum with decreasing wavelength, for example, an absorption depth of about 10 µm for 800 nm radiation, 3 µm for 600 nm radiation and about 1 µm for 500 nm. Accordingly, the shorter activation wavelengths are advantageous for generating free carriers only very near the wafer surface to confine the heating to near the surface. Thus, for some applications, an even shorter activating wavelength is desired, such as 532 nm radiation from a frequency-doubled Nd:YAG laser, which can be characterized as green.

Although it is possible to modify the apparatus of Markle or Jennings for single beam irradiation with a shorter wavelength, it is difficult to obtain high power with these shorter wavelengths, particularly from diode lasers. In contrast, with the dual beams, the short wavelength radiation is used only for generating free carriers and thus activating the absorption of the long wavelength radiation and thus does not need be high powered.

It is preferred that the infrared absorption be dominated by free carriers which have been generated at the surface of the wafer by the shorter wavelength laser. This effectively gives the 10.6 micron radiation the same absorption length as the shorter wavelength. It is also preferred that the shorter-wavelength radiation creates a substantial number of free carriers such that the infrared absorption is still saturated even when optical interference effects reduce the shorter wavelength's transmission into the wafer. Optical interference effects can reduce the power admitted into the wafer by as much as 80% for certain film stacks that are in use today in the semiconductor industry. This requires that the infrared free carrier absorption effect is saturated when only 20% of the shorter-wavelength laser's power actually propagates into the wafer. The shorter-wavelength laser's power density must be at least five times the saturation value but it must also not be so high as to contribute appreciably to the direct heating of the substrate. With the present invention, it is possible that the power density of the shorter-wavelength radiation is more than adequate to assure saturated infrared absorption yet it is much less than the power density of the $CO_2$ laser. Therefore, the shorter wavelength does not contribute to the heating of the wafer and subsequently does not degrade the uniformity of heating. This effect is advantageous since there is a large variability in admitted power for the shorter wavelength.

Although various operational parameters may be used, the following exemplary values are illustrative. The $CO_2$ laser may have a total optical output power of 100 W, which after focusing and beam shaping irradiates the wafer with an optical power density of about 150 kW/cm². In contrast, the visible laser is effective with an optical output power of 1 to 2 W. The $CO_2$ beam striking the wafer may have a width of 50 µm and a length of 100 µm to 1 mm. With these short line widths, the $CO_2$ beam needs to be scanned in a serpentine pattern to cover the entire wafer.

Although the invention is not so limited, a red activating beam is preferred rather than green to process some types of advanced integrated circuits having a structure near the surface illustrated in the cross-sectional view of FIG. 4. A silicon wafer 60 having a thin surface implant layer 62 requiring anneal is covered with an amorphous silicon layer 64 having a thickness of about 50 nm. Green activation radiation 66, for example, from a Nd:YAG laser, incident upon the top surface is absorbed by the amorphous silicon layer 64, but the free carriers generated quickly recombine because of the disordered state in the amorphous material. The high recombination rate greatly reduces the free carrier concentration and hence the absorption of the 10.6 µm radiation by the free carriers. As a result, those regions manifest very long absorption lengths for the 10.6 µm light and the substrate is not effectively heated in those regions. As a result, the direct heating is concentrated in the amorphous layer 64 and is not efficient. In contrast, red activation radiation 66, for example, from a GaAs laser bar, is only partially absorbed in the amorphous layer 64, and the bulk of the remaining portion is absorbed in the top few microns of the silicon 60, where the lifetimes of the free carriers is high, thus assuring strong absorption of the 10.6 µm $CO_2$ radiation. It is thus seen that the depth of thermal treatment within the wafer can be controlled by selecting the wavelength of the activating light. A shorter wavelength is absorbed closer to the surface and hence promotes annealing there while a longer wavelength is absorbed more deeply and extends the thermal annealing to those depths. A shallow heating region is particularly important for annealing ultra-shallow dopant implants used in advanced devices.

Figure 5:
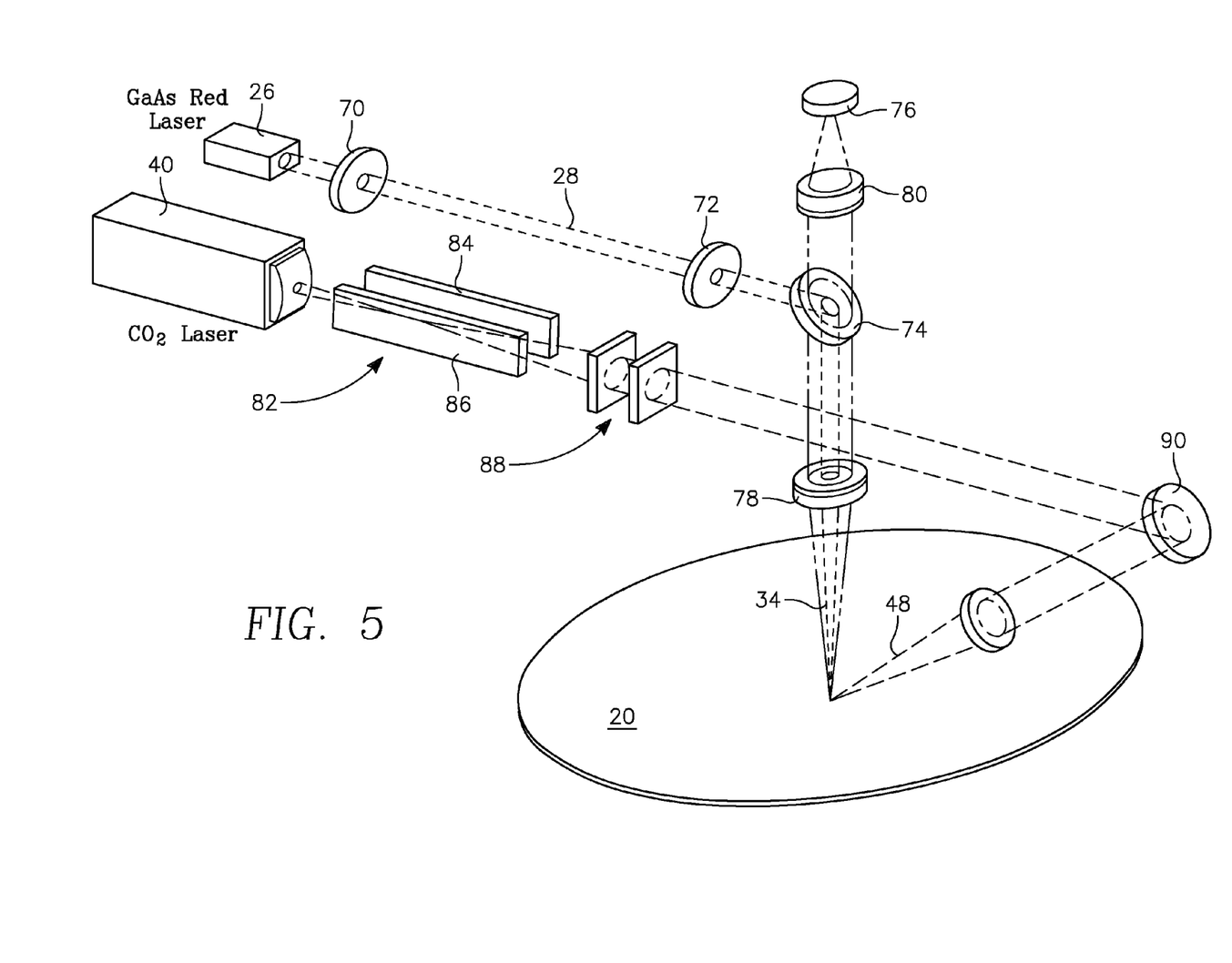
FIG. 5 is an orthographic view of the annealing apparatus of FIG. 2 including more of the optical elements.

The optics illustrated in FIG. 2 are overly simplified. A more complete set of optics is illustrated in FIG. 5 although several other optical elements will be described separately. A blow up of the beam area is shown in FIG. 6. The optics of the activation beam emanating from the GaAs laser 26 are relatively simple. Relay optics including two lenses 70, 72 produce the desirable overlap of the sub-beams from the different GaAs diode lasers of the laser bar. Complete homogenization is not required if the free carriers are saturated. Additional free carriers cannot increase the infrared absorption above 100%. A tilted interference mirror 74 deflects the 810 nm radiation of the red GaAs laser 26 to strike the wafer 20 at approximately a normal angle. However, the interference mirror 74, particularly in the reverse direction, passes longer infrared radiation indicative of the wafer temperature to a pyrometer 76, which may be a single detector or a CCD (charge coupled device) array. In the latter case, a thermal image in vicinity of the radiation line is available. An objective lens 78 focuses the red beam 28 onto the wafer 20 as the activating beam 34. As illustrated, the focused activating beam 34 has a generally rectangular shape arising from the linear array of diode lasers in the GaAs laser bar. The same objective lens 78 collimates longer wavelength light emitted over a large angle, e.g. a 15° cone half angle, from the area of the wafer 20 being scanned. The reflector 74 is relatively transmissive at the longer wavelength and passes the collimated infrared beam. Another objective lens 80 focuses the infrared beam on the pyrometer 76, thus allowing real-time monitoring of the maximum temperature reached on the wafer 20. The wavelength of the pyrometer 76 may be selected from wavelengths between 0.96 and 2.5 µm, with 1.55 µm being the preferred wavelength. Glasses used to make lenses at these wavelengths typically absorb 10.6 µm radiation and thus effectively filter it out. Any $CO_2$ radiation at 10.6 µm would need to scatter into the pyrometer 76. Because scattering is inversely proportional to wavelength, the pyrometer 76 is not sensitive to the $CO_2$ radiation.

The output of the $CO_2$ laser 40 passes through optics, to be described in more detailed later, including a 1-axis light pipe 82 including two parallel reflectors 84, 86 separated by a small gap aligned along the fast axis and extending along the beam axis and in the transverse direction along the slow axis. The fast axis refers to the axis of the heating beam on the wafer along which the line is quickly scanned, that is, the short dimension of the line beam. The slow axis refers to the transverse axis along which the beam is indexed in discrete displacements between steps of the serpentine scan, that is, the long dimension of the line beam. Any reflector introduced into the light path causes the fast and slow axes to be reoriented accordingly. The light pipe 82 causes the beam to homogenize along the slow (long) axis by spreading out the coherence speckle by about a factor of 200×, by similarly improving beam uniformity, and by flattening the beam shape along that axis. Anamorphic optics 88, that is, a lens system having different focal lengths along the fast and slow axes, allows diffraction limited focusing along fast axis while not so limiting the line beam length along the slow axis. A reflector 90 is oriented to direct the $CO_2$ beam 48 to strike the wafer 20 at the Brewster angle, which is about 72° from the normal for silicon, to maximize coupling of the $CO_2$ beam 48 into the wafer 20 when the beam hasp linear polarization, that is, the beam polarization perpendicular to the beam polarization direction within the plane of the wafer 20.

Figure 7:
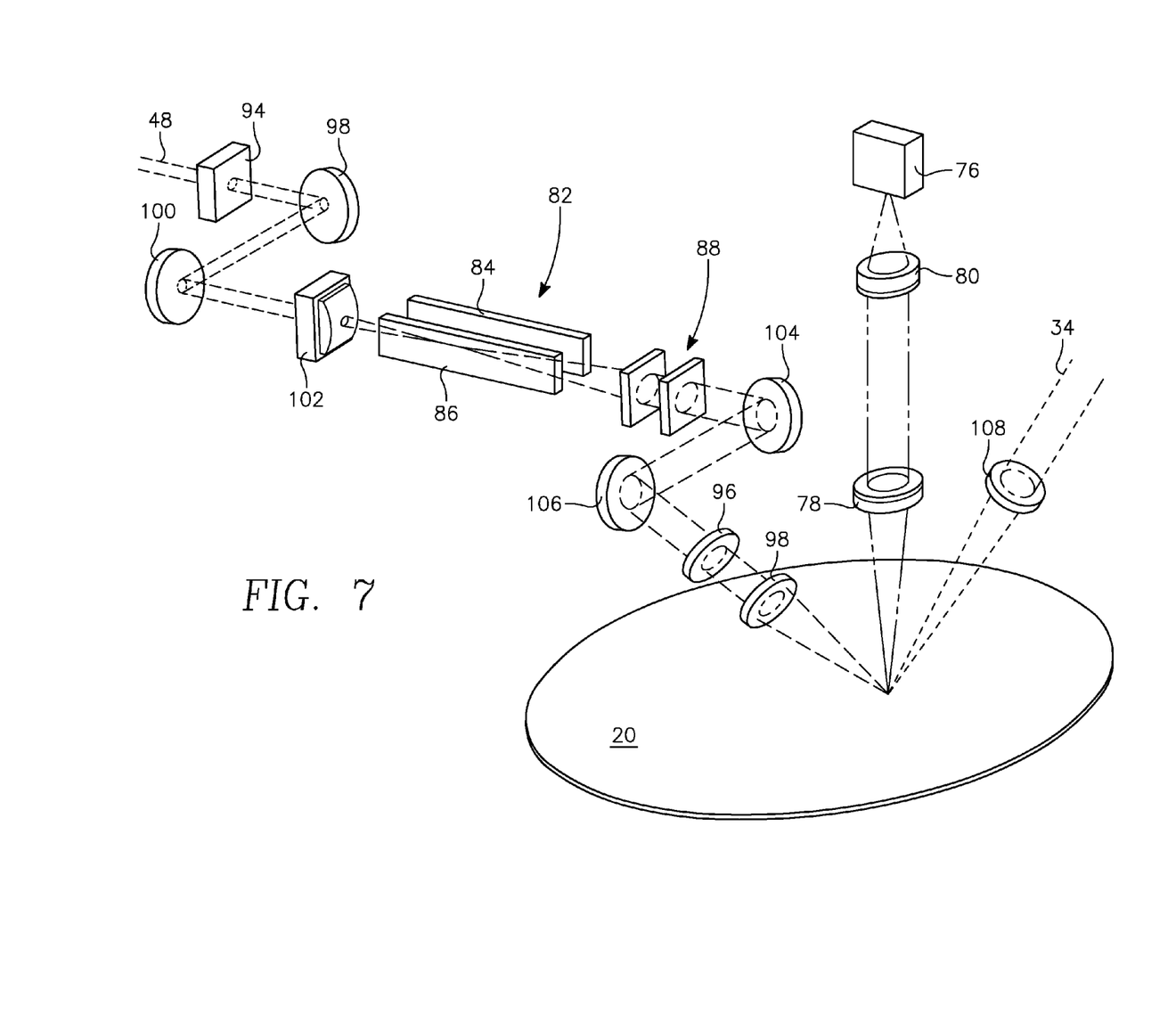
FIG. 7 is an orthographic view of the optics of another embodiment of the invention.

A related embodiment is illustrated in FIG. 7. An acousto-optical deflector (AOD) 94 receives the optical output beam 48 from the $CO_2$ laser 42. The AOD 94 includes, for example, a germanium crystal having an ultrasonic transducer bonded on one end and an absorber. An RF signal electrically drives the transducer with an oscillatory signal of 20 MHz±5 MHz to modulate the density of the germanium and set up an interference grating that diffracts about 80% of the incident light by, for example, about 5° from the incident direction dependent upon the drive frequency. The drive frequency is further varied at 1 MHz across the 10 MHz band to vary the diffraction angle and thus deflect and dither the beam along in the slow axis over a range of about 1°, that is, to angularly or spatially scan the beam. The AOD scanning spreads out the coherence speckle and interference fringes in the laser beam by a factor of about 200× and further homogenizes the beam along the slow axis.

In a further variation, it is possible in some applications to input a small single beam into the AOD 94 and use the AOD 94 to scan the small beam over the entire length of the heating beam 48 along the slow axis.

A first 45° phase retarding mirror 98 reflects the beam and converts it from linear to circular polarization. A second 45° phase retarding mirror 100 reflects the beam and converts it from circular to linear polarization but with a net rotation of 90° between the two mirrors 98, 100. A cylindrical lens 102 acts in conjunction with a later cylindrical lens as a beam expander.

The $CO_2$ beam then enters the 1-axis light pipe 82 with the two parallel reflectors 84, 86 separated along the slow axis and extending along the beam axis. The acousto-optical deflector 94 scans the beam in the direction across the light pipe gap, that is, from right to left of the two reflectors 84, 86 over an angular range of about 20 mrad (about 1°). The scanned beam then enters the anamorphic optics 88, the first lens of which is cylindrical and acts as part of the beam expander. Two turning mirrors 90, 92 reflect the beam to produce a more compact overall design. Final anamorphic imaging lenses 94, 96 produce the final line beam having a well controlled length and narrow width.

In this embodiment, the lenses 78, 80 for the pyrometer 76 create a thermal monitoring beam that is aligned close to the wafer normal and separated from the activating beam 34 from the GaAs diode laser source 26, which is set at a somewhat oblique angle, for example, 30° off normal. An imaging lens 108 performs the final focusing the GaAs beam over the fairly large activating beam.

Although the above embodiment has utilized $CO_2$ radiation at about 10.6 μm, other wavelengths for the heating radiation may be used. They should have a photon energy less than the silicon bandgap energy, that is, a wavelength greater than about 1.2 μm. Typically, the heating wavelength is greater than about 5 μm. Two specific wavelengths for the activating radiation have been discussed. Other wavelengths are readily available in semiconductor diode lasers and may be selected to control the depth of the thermal processing. Generally, however, the photon energy of the activating radiation needs to be greater than the silicon bandgap energy, that is, a wavelength less than about 1.0 μm.

Although the description of the invention has assumed that the substrate is a silicon wafer, the invention is not so limited. The invention is advantageously applied to SOI (silicon on insulator) wafers or other substrates having a thin silicon layer formed over an insulating layer or substrate. With suitable modifications for the activating and heating wavelengths relative to semiconductor bandgaps, the invention can be applied to other semiconductor materials. That is, the heating wavelength is greater than the semiconductor bandgap wavelength and the activating wavelength is less than the semiconductor bandgap wavelength.

The invention claimed is:

1. A method of thermally treating a substrate comprising a semiconductor having a bandgap energy, comprising the steps of:
    directing the output of a first source of electromagnetic radiation having a first photon energy greater than said bandgap energy onto said substrate as an elongate first beam having a first dimension along a first axis substantially smaller than a second dimension along a perpendicular second axis;
    directing the output of a second source of electromagnetic radiation having a second photon energy less than said bandgap energy onto said substrate as a second beam which is surrounded by the first beam; and
    scanning said first and second beams relative to the substrate in substantial synchronism along said first axis.

2. The method of claim 1, wherein said first dimension is no more than 0.5 mm and said second dimension is at least 1 mm.

3. The method of claim 1, wherein said first source is a $CO_2$ laser and said second source is one or more diode lasers.

4. The method of claim 1, wherein said second photon energy is selected to control a depth of heating in said substrate.

5. The method of claim 1, wherein said substrate comprises a silicon substrate.

6. The method of claim 5, wherein said bandgap energy is approximately 1.12 eV.

7. The method of claim 1, wherein an optical power density of said second beam is sufficiently high that radiation of said second photon energy saturates the absorption of said substrate.

8. The method of claim 1, wherein the first and second beams are stationary and a stage on which the substrate is supported is moved during the scanning step.

9. A method of thermally treating a substrate comprising a semiconductor having a bandgap wavelength, comprising the steps of:
    directing the output of a first source of electromagnetic radiation having a first photon wavelength greater than the bandgap wavelength onto said substrate as an elongate first beam having a first dimension along a first direction substantially smaller than a second dimension along a perpendicular second direction;
    directing the output of a second source of electromagnetic radiation having a second photon wavelength less than the bandgap wavelength onto said substrate as a second beam;
    scanning the first beam relative to the substrate along the first direction; and
    scanning the second beam relative to the substrate so that it surrounds the scanned first beam.

10. The method of claim 9, wherein the first dimension is no more than 0.5 mm and the second dimension is at least 1 mm.

11. The method of claim 9, wherein the first source is a $CO_2$ laser and the second source is one or more diode lasers.

12. The method of claim 9, wherein said second wavelength is selected to control a depth of heating in said substrate.

13. The method of claim 9, wherein the substrate comprises a silicon substrate.

14. The method of claim 13, wherein the bandgap wavelength is approximately 1110 nm.

15. The method of claim 9, wherein an optical power density of said second beam is sufficiently high that radiation of said second photon wavelength saturates the absorption of the substrate.

16. A method of thermally treating a substrate comprising a semiconductor, comprising the steps of:

directing towards the substrate a first beam of optical radiation having a first wavelength capable of generating free carriers in the semiconductor; and scanning over the substrate within the first beam a second beam of optical radiation having a second wavelength capable of interacting with the free carriers and heating the substrate.

17. The method of claim 16, wherein the first wavelength is less than a bandgap wavelength of the semiconductor and the second wavelength is greater than the bandgap wavelength.

18. The method of claim 17, wherein the second beam is produced by a $CO_2$ laser.

19. The method of claim 16, wherein the second beam is an elongate beam having a first dimension along a first direction substantially smaller than a second dimension along a perpendicular second direction and wherein the scanning is performed along the first direction.

20. The method of claim 16, further comprising scanning the first beam over the substrate in a manner that the scanned first beam surrounds the scanned second beam.

* * * * *